US010923342B2

(12) United States Patent
Osaki et al.

(10) Patent No.: US 10,923,342 B2
(45) Date of Patent: Feb. 16, 2021

(54) SELECTIVE MODIFICATION METHOD OF A BASE MATERIAL SURFACE

(71) Applicant: JSR CORPORATION, Tokyo (JP)

(72) Inventors: Hitoshi Osaki, Tokyo (JP); Hiroyuki Komatsu, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/550,695

(22) Filed: Aug. 26, 2019

(65) Prior Publication Data
US 2020/0051813 A1 Feb. 13, 2020

Related U.S. Application Data

(63) Continuation of application No. PCT/JP2018/006463, filed on Feb. 22, 2018.

(60) Provisional application No. 62/464,026, filed on Feb. 27, 2017.

(51) Int. Cl.
H01L 21/02 (2006.01)

(52) U.S. Cl.
CPC .... H01L 21/02326 (2013.01); H01L 21/0234 (2013.01); H01L 21/02175 (2013.01)

(58) Field of Classification Search
None
See application file for complete search history.

(56) References Cited

U.S. PATENT DOCUMENTS

2007/0269883 A1  11/2007  Uhrich
2014/0042662 A1*  2/2014  Tamada ................. B29C 39/02
                                                    264/138

FOREIGN PATENT DOCUMENTS

JP  2003-76036 A  3/2003
JP  2016-25355 A  2/2016

OTHER PUBLICATIONS

International Search Report dated May 22, 2018 in PCT/JP2018/006463 (with English translation), 3 pages.
Written Opinion of the International Searching Authority dated May 22, 2018 in PCT/JP2018/006463 (with English translation), 7 pages.
Haeshin L., et al., "Mussel-Inspired Surface Chemistry for Multifunctional Coatings" Science, Oct. 19, 2007, vol. 316 No. 5849, pp. 426-430.
Hashemi, F.S.M., et al., "Self-Correcting Process for High Quality Patterning by Atomic Layer Deposition", ACS Nano, 2015, vol. 9 No. 9, pp. 8710-8717.
Fang, M., et al., "Area-Setective Atomic Layer Deposition: Conformal Coating; Subnanometer Thickness Control, and Small Positioning", ACS Nano, 2015, vol. 9 No. 9, pp. 8651-8654.
Hozumi, A. et al., "Preparation of a Well-Defined Amino-Terminated Self-Assembled Monolayer and Copper Microlines on a Polyimide Substrate Covered with an Oxide Nanoskin", Langmuir, vol. 21, 2005, pp. 8234-8242.

* cited by examiner

Primary Examiner — Asok K Sarkar
(74) Attorney, Agent, or Firm — Oblon, McClelland, Maier & Neustadt, L.L.P.

(57) ABSTRACT

A selective modification method of a base material surface includes subjecting at least a part of a surface of a base material to at least one surface treatment selected from the group consisting of an oxidization treatment and a hydrophilization treatment. The base material includes a surface layer and includes an oxide, a nitride or an oxynitride of silicon, or a combination thereof in a first region of the surface layer. A nonphotosensitive composition is applied directly or indirectly on the surface of the base material after the surface treatment. The nonphotosensitive composition includes: a first polymer containing a nitrogen atom; and a solvent. It is preferred that the base material contains a metal in a second region which is other than the first region of the surface layer. In the surface treatment step, an $O_2$ plasma treatment is preferably conducted.

20 Claims, No Drawings

SELECTIVE MODIFICATION METHOD OF A BASE MATERIAL SURFACE

CROSS-REFERENCE TO RELATED APPLICATIONS

The present application is a continuation application of International Application No. PCT/JP2018/006463, filed Feb. 22, 2018, which claims priority to U.S. Provisional Patent Application No. 62/464,026, filed Feb. 27, 2017. The contents of these applications are incorporated herein by reference in their entirety.

BACKGROUND OF THE INVENTION

Field of the Invention

The present invention relates to a selective modification method of a base material surface.

Discussion of the Background

Further miniaturization of semiconductor devices has been accompanied by a demand for a technique of forming a fine pattern having a line width of less than 30 nm. However, it is technically difficult to meet such a demand by conventional methods employing lithography, due to optical factors and the like.

To this end, a bottom-up technique, as generally referred to, has been contemplated for forming a fine pattern. As the bottom-up technique, in addition to a method employing directed self-assembly of a polymer, a method for selectively modifying a base material having a surface layer that includes fine regions has been recently studied. The method for selectivity modifying the base material requires a material enabling easy and highly selective modification at surface regions, and various materials have been investigated for such use (see Japanese Unexamined Patent Application, Publication No. 2016-25355; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

SUMMARY OF THE INVENTION

According to an aspect of the present invention, a selective modification method of a base material surface includes subjecting at least a part of a surface of a base material to at least one surface treatment selected from the group consisting of an oxidization treatment and a hydrophilization treatment. The base material includes a surface layer and includes an oxide, a nitride or an oxynitride of silicon, or a combination thereof in a first region of the surface layer. A nonphotosensitive composition is applied directly or indirectly on the surface of the base material after the surface treatment. The nonphotosensitive composition includes: a first polymer containing a nitrogen atom; and a solvent.

DESCRIPTION OF EMBODIMENTS

According to an embodiment of the invention, a selective modification method of a base material surface includes: preparing a base material that has a surface layer and contains an oxide, a nitride or an oxynitride of silicon, or a combination thereof in a first region of the surface layer; subjecting at least a part of the base material surface to at least one surface treatment selected from an oxidization treatment and a hydrophilization treatment; and applying a nonphotosensitive composition directly or indirectly on the base material surface after the surface treatment, wherein the nonphotosensitive composition contains: a first polymer that includes a nitrogen atom; and a solvent.

The aforementioned conventional materials are low-molecular materials and therefore have disadvantages of: being unsuitable for application by spin coating in preexisting processes and requiring a Langmuir-Blodgett method which is low in efficiency; and being inferior in heat resistance.

On the other hand, the high-molecular material, which is high in viscosity and heat resistant, has been believed to be incapable of efficiently modifying a base material surface due to great steric hindrance.

The selective modification method of a base material surface according to the embodiment of the present invention enables convenient and highly selective modification at a surface region where an oxide, a nitride or an oxynitride of silicon, or a combination thereof (hereinafter, may be also referred to as "oxide, etc., of silicon") is contained. Therefore, the selective modification method of a base material surface can be suitably used for working processes of semiconductor devices, and the like, in which microfabrication is expected to be further in progress hereafter.

Hereinafter, embodiments of the selective modification method of a base material surface (hereinafter, may be merely referred to as "selective modification method") are described in detail.

Selective Modification Method

The selective modification method of the embodiment of the present invention includes: preparing a base material (hereinafter, may be also referred to as "base material (P)") that has a surface layer (hereinafter, may be also referred to as "surface layer (X)") and contains an oxide, a nitride or an oxynitride of silicon, or a combination thereof in a first region (hereinafter, may be also referred to as "region (I)") of the surface layer (X) (hereinafter, may be also referred to as "preparing step"); subjecting at least a part of the base material (P) surface to at least one surface treatment selected from an oxidization treatment and a hydrophilization treatment (hereinafter, may be also referred to as "surface treatment step"); and applying a nonphotosensitive composition (hereinafter, may be also referred to as "composition (S)") directly or indirectly on the base material (P) surface after the surface treatment (hereinafter, may be also referred to as "applying step"). The composition (S) contains: a first polymer (hereinafter, may be also referred to as "(A) polymer" or "polymer (A)") that includes a nitrogen atom; and a solvent (hereinafter, may be also referred to as "(B) solvent" or "solvent (B)").

Since each step described above is included, and the composition (S) containing the polymer (A) that includes a nitrogen atom is used, the selective modification method enables convenient and highly selective modification at a surface region where the oxide, etc., of silicon is contained. Although not necessarily clarified and without wishing to be bound by any theory, the reason for achieving the effects described above by the selective modification method due to having the aforementioned constitution is inferred as in the following, for example. It is considered that even when the surface treatment is carried out, an interaction ss of the polymer (A) is still enabled due to the oxide, etc., of silicon having Si—OH or the like, by means of the hydrogen bond with the nitrogen atom, unlike a metal that may fail to interact with the polymer (A) through conversion into an oxide or the like. Hereinafter, each step will be described.

Preparing Step

In this step, a base material (P) is prepared which has the surface layer (X) and contains an oxide, a nitride or an oxynitride of silicon, or a combination thereof in the region (I) of the surface layer (X).

Examples of the oxide of silicon in the region (I) include $SiO_2$ and the like; examples of the nitride of silicon include SiNx, $Si_3N_4$ and the like; and examples of the oxynitride of silicon include SiON and the like. As the oxide, etc., of silicon in the region (I), the oxide of silicon is preferred, and $SiO_2$ is more preferred.

The base material (P) having the region (I) is exemplified by an interlayer insulating film containing silicon oxide, silicon nitride or the like as a principal component, and the like. The "principal component as referred to means a component contained at the largest percentage content, and preferably a component contained at a percentage content of no less than 50% by mass.

It is preferred that the base material (P) contains a metal (hereinafter, may be also referred to as "metal (M)") in a second region (hereinafter, may be also referred to as "region (II)") which is other than the region (I) of the surface layer (X).

The metal (M) is not particularly limited as long as it is a metal element. It is to be noted that silicon is a nonmetal, and not falling under the metal. Examples of the metal (M) include copper, iron, zinc, cobalt, aluminum, tin, tungsten, zirconium, titanium, tantalum, germanium, molybdenum, ruthenium, gold, silver, platinum, palladium, nickel and the like. Of these, copper, cobalt or tungsten is preferred.

The metal (M) may be included in the region (II) in a form of, for example, a metal simple substance, an alloy, an electric conductive nitride, a metal oxide, a silicide, or the like.

Examples of the metal simple substance include simple substances of metals such as copper, iron, cobalt, tungsten and tantalum, and the like.

Examples of the alloy include a nickel-copper alloy, a cobalt-nickel alloy, a gold-silver alloy, and the like.

Examples of the electric conductive nitride include tantalum nitride, titanium nitride, iron nitride, aluminum nitride, and the like.

Examples of the metal oxide include tantalum oxide, aluminum oxide, iron oxide, copper oxide, and the like.

Examples of the silicide include iron silicide, molybdenum silicide, and the like.

Of these, the metal simple substance, the alloy, the electric conductive nitride or the silicide is preferred, the metal simple substance is more preferred, and a copper simple substance, a cobalt simple substance or a tungsten simple substance is still more preferred.

The region (I) and the region (II) of the surface layer (X) may be present in any mode, and the mode of the arrangement is exemplified by surficial, spotted, striped and the like in a planar view, but not limited thereto. The size of the region (I) and the region (II) is not particularly limited, and may be an appropriately desired size.

The shape of the base material (P) is not particularly limited, and may be an appropriately desired shape such as platy (substrate), spherical, and the like.

The base material (P) having the region (I) and the region (II) may be provided by, for example: forming on a substrate containing a metal, an interlayer film containing the oxide, etc., of silicon as a principal component; forming a resist pattern on the interlayer film; and then etching the interlayer film by a gas etching treatment using the resist pattern as a mask; or the like. The base material formed in such a manner is, for example, a base material (hereinafter, may be also referred to as "base material (Q)") having: the region (I) on side-wall surfaces of the pattern; and a pattern (for example, trench pattern) formed in the region (II) on the bottom faces of the space portions.

Surface Treatment Step

In this step, at least a part of the surface of the base material (P) is subjected to at least one surface treatment selected from an oxidization treatment and a hydrophilization treatment. It is preferred that the entire surface of the base material (P) is subjected to the surface treatment. The "oxidization treatment" as referred to means a treatment that causes oxidization of a substance of a base material surface. The "hydrophilization treatment" as referred to means to increase hydrophilicity of the base material surface by carrying out this treatment, as compared with that before the treatment. An increase in the hydrophilicity of the base material surface may be determined from, for example, a decrease of a contact angle of water as compared with that before the hydrophilization treatment, or the like. By carrying out the surface treatment, both the oxidization and the hydrophilization may occur, or one of these may occur. The surface treatment is preferably an oxidization treatment.

Examples of a procedure of the surface treatment include: gas plasma treatments such as an $O_2$ plasma treatment, a $N_2$ plasma treatment, an Ar plasma treatment, a fluorine gas plasma treatment and a chlorine gas plasma treatment; ultraviolet ray/ozone treatments; a corona treatment; and the like. Of these, in light of a capability of more selectively modifying the base material surface, the gas plasma treatment is preferred, and the $O_2$ plasma treatment is more preferred.

The lower limit of the pressure in the 02 plasma treatment is preferably 1.33 Pa, and more preferably 13.3 Pa. The upper limit of the pressure is preferably 66.5 Pa, and more preferably 26.6 Pa. The lower limit of the output of plasma in the 02 plasma treatment is preferably 5 W, and more preferably 10 W. The upper limit of the output of plasma is preferably 500 W, and more preferably 100 W. The lower limit of the treatment time period in the 02 plasma treatment is preferably 1 sec, and more preferably 2 sec. The upper limit of the treatment time period is preferably 30 sec, and more preferably 5 sec. The upper limit of the temperature in the 02 plasma treatment is preferably −30° C., more preferably 0° C., and still more preferably 5° C. The upper limit of the temperature is preferably 300° C., more preferably 100° C., and still more preferably 40° C.

Applying Step

In this step, the composition (S) is applied on the surface of the base material (P) after the surface treatment step. The composition (S) is described below.

Composition (S)

The composition (S) is a nonphotosensitive composition and contains the polymer (A) and the solvent (B). The term "nonphotosensitive" as referred to means a characteristic that a molecular weight-increasing reaction, an acid-labile group dissociation reaction or the like of the polymer contained in the composition is not substantially caused upon an exposure to an electromagnetic wave, a charged particle ray or the like, and thus solubility of the polymer in a developer solution is not substantially changed. In the nonphotosensitive composition, the polymer (A) typically does not have a polymerizable group, a crosslinkable group, etc., and/or does not include a photosensitive acid generating agent and the like. The composition (S) may contain other component in addition to the polymer (A) and the solvent (B). Each component is described below.

(A) Polymer

The polymer (A) includes a nitrogen atom (hereinafter, may be also referred to as "nitrogen atom (A)"). The polymer (A) may include one, or two or more nitrogen atom(s) (A).

The nitrogen atom (A) preferably has an unshared electron pair.

The lower limit of pKa of a conjugate acid obtained by adding a proton to the nitrogen atom (A) is preferably 3, more preferably 5, still more preferably 7, and particularly preferably 9. The upper limit of the pKa is, for example, 14. When the pKa of the conjugate acid of the nitrogen atom (A) falls within the above range, the selectivity of modification of the base material surface can be more improved. The conjugate acid of the nitrogen atom (A) as referred to means a compound generated through coordinate bonding of a proton to an unshared electron pair included in the nitrogen atom (A).

The polymer (A) may include the nitrogen atom (A) in any one of, or two or more of, a main chain, a side chain, and a group bonded to an end of the main chain (hereinafter, may be also referred to as "terminal group (X)"). The "main chain" as referred to means an atom chain that is the longest in the chain polymer (A). The "side chain" as referred to means an atom chain other than the main chain in the polymer (A).

Examples of the polymer (A) that includes the nitrogen atom (A) in the main chain (hereinafter, may be also referred to as "(A1) polymer" or "polymer (A1)") include polyimines, polyamides, polyimides, and the like.

The polymer (A) that includes the nitrogen atom (A) in the side chain (hereinafter, may be also referred to as "(A2) polymer" or "polymer (A2)") is exemplified by a polymer having a structural unit (hereinafter, may be also referred to as "structural unit (I)") including a group (hereinafter, may be also referred to as "group (I)") that includes the nitrogen atom (A), and the like. The polymer (A2) may have one, or two or more types of the structural unit (I).

The group (I) is exemplified by a monovalent group such as a primary amino group (—NH$_2$), a secondary amino group, a tertiary amino group, a nitrogen atom-containing aromatic heterocyclic group and the like.

Examples of the secondary amino group include monohydrocarbon group-substituted amino groups such as a methylamino group, an ethylamino group, a cyclopentylamino group, a cyclohexylamino group, a phenylamino group and a benzylamino group, and the like.

Examples of the tertiary amino group include: dihydrocarbon group-substituted amino groups such as a dimethylamino group, a diethylamino group, a dicyclopentylamino group, a dicyclohexylamino group, a diphenylamino group, a dibenzylamino group, a methylethylamino group and a phenylmethylamino group; cyclic amino groups such as a 1-pyrrolidinyl group, a 1-piperidyl group and a 4-morpholino group; and the like.

Examples of the nitrogen atom-containing aromatic heterocyclic group include a pyrrolyl group, an indolyl group, a carbazolyl group, a pyridyl group, a quinolyl group, a phenanthryl group, an imidazolyl group, a pyrazinyl group, a pyrimidinyl group, a pyridazinyl group, and the like.

Examples of the structural unit (I) include a structural unit represented by the following formula (1), and the like.

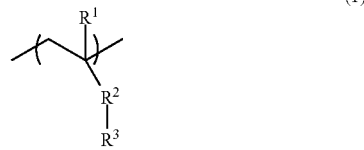

In the above formula (1), $R^1$ represents a hydrogen atom or a methyl group; $R^2$ represents —O—, —CO—, —COO—, —CONH—, a divalent hydrocarbon group, a group obtained by combining two or more thereof, or a single bond; and $R^3$ represents the monovalent group (I).

$R^1$ represents preferably a methyl group.

Examples of the divalent hydrocarbon group represented by $R^2$ include:

divalent chain hydrocarbon groups such as a methanediyl group, an ethanediyl group and a propanediyl group;

divalent alicyclic hydrocarbon groups such as a cyclopentanediyl group and a cyclohexanediyl group;

divalent aromatic hydrocarbon groups such as a benzenediyl group and a naphthalenediyl group; and the like.

Examples of $R^2$ include carbonyloxyalkanediyl groups such as a carbonyloxymethanediyl group and a carbonyloxyethanediyl group, and the like. Of these, the carbonyloxyethanediyl group is preferred.

$R^3$ represents preferably the tertiary amino group, more preferably a dialkylamino group, and still more preferably a dimethylamino group.

The lower limit of the proportion of the structural unit (I) contained with respect to the total structural units constituting the polymer (A2) is preferably 0.1 mol %, more preferably 0.5 mol %, still more preferably 1 mol %, and particularly preferably 2 mol %. The upper limit of the proportion of the structural unit (I) is preferably 90 mol %, more preferably 30 mol %, still more preferably 15 mol %, and particularly preferably 8 mol %. When the proportion of the structural unit (I) contained falls within the above range, the selectivity of modification of the base material surface can be more improved.

The polymer (A2) may also have a structural unit (hereinafter, may be also referred to as "structural unit (II)") other than the structural unit (I). The polymer (A2) may have one, or two or more types of the structural unit (II).

The structural unit (II) is exemplified by a structural unit derived from a substituted or unsubstituted styrene, a structural unit derived from a (meth)acrylic acid or (meth)acrylic acid ester, a structural unit derived from a substituted or unsubstituted ethylene, and the like. The polymer (A2) may have one, or two or more types of each the other structural unit.

Examples of the substituted styrene include α-methylstyrene, o-, m- or p-methylstyrene, p-t-butylstyrene, 2,4,6-trimethylstyrene, p-methoxystyrene, p-t-butoxystyrene, o-, m- or p-vinylstyrene, o-, m- or p-hydroxystyrene, m- or p-chloromethylstyrene, p-chlorostyrene, p-bromostyrene, p-iodostyrene, p-nitrostyrene, p-cyanostyrene, and the like.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth) acrylate and naphthyl (meth)acrylate;

(meth)acrylic acid substituted alkyl esters such as 2-hydroxyethyl (meth)acrylate, 3-hydroxyadamantyl (meth) acrylate, 3-glycidylpropyl (meth)acrylate and 3-trimethyl silylpropyl (meth)acrylate; and the like.

Examples of the substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene, vinyl glycidyl ether and vinyl trimethyl silyl ether; and the like.

The structural unit (II) is preferably a structural unit derived from the substituted or unsubstituted styrene and a structural unit derived from the (meth)acrylic acid ester, more preferably a structural unit derived from the substituted or unsubstituted styrene, and still more preferably a structural unit derived from the unsubstituted styrene. When the structural unit (II) is the aforementioned structural unit, selectivity of modification of the base material surface can be more improved.

In a case in which the polymer (A2) has the structural unit (II), the lower limit of the proportion of the structural unit (II) contained with respect to the total structural units constituting the polymer (A2) is preferably 10 mol %, more preferably 70 mol %, still more preferably 80 mol %, and particularly preferably 90 mol %. The upper limit of the proportion of the polymer (A2) is preferably 99.9 mol %, more preferably 99.5 mol %, still more preferably 99 mol %, and particularly preferably 98 mol %.

The polymer (A2) having the structural unit (I) and the structural unit (II) may be either a random copolymer or a block copolymer, and in light of an improvement of selectivity of modification of the base material surface, the polymer (A2) is preferably a block copolymer, more preferably a block copolymer having one type of the structural unit (I) at one end of the main chain, and still more preferably a diblock copolymer having one type of the structural unit (I) and one type of the structural unit (II).

Examples of the terminal group (X) in the polymer (hereinafter, may be also referred to as "(A3) polymer" or "polymer (A3)") that includes the nitrogen atom (A) in the terminal group (X) include groups and the like that each include the group exemplified as the group (I) in the polymer (A2). The terminal group (X) is preferably an alkyl group a hydrogen atom of which has been substituted with the group (I), more preferably an alkyl group a hydrogen atom of which has been substituted with a primary to tertiary amino group, and still more preferably an aminopropyl group.

The polymer (A3) may have the terminal group (X) at either one end or both ends of the main chain, and in light of improvement of the selectivity of modification of the base material surface, the polymer (A3) preferably has the terminal group (X) at one end of the main chain.

The polymer (A) may be produced by a well-known procedure by living anionic polymerization or the like using a pertinent monomer, for example.

The lower limit of the weight-average molecular weight (Mw) of the polymer (A) is preferably 500, more preferably 2,000, still more preferably 4,000, and particularly preferably 5,000. The upper limit of Mw is preferably 50,000, more preferably 40,000, still more preferably 30,000, and particularly preferably 10,000.

The lower limit of the number-average molecular weight (Mn) of the polymer (A) is preferably 500, more preferably 2,000, still more preferably 4,000, and particularly preferably 5,000. The upper limit of Mn is preferably 50,000, more preferably 40,000, still more preferably 30,000, and particularly preferably 10,000.

The upper limit of a ratio (Mw/Mn, dispersity index) of Mw to Mn of the polymer (A) is preferably 5, more preferably 2, still more preferably 1.5, and particularly preferably 1.2. The lower limit of the ratio is typically 1, preferably 1.03, and more preferably 1.1.

Herein, Mw and Mn of the polymer (A) are values each determined by gel permeation chromatography (GPC) using GPC columns (Tosoh Corporation; "G2000 HXL"×2, "G3000 HXL"×1 and "G4000 HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 µL;

column temperature: 40° C.;

detector: differential refractometer; and standard substance: mono-dispersed polystyrene.

The lower limit of the content of the polymer (A) in the composition (S) with respect to the total solid content is preferably 80% by mass, more preferably 90% by mass, and still more preferably 95% by mass. The upper limit of the content is, for example, 100% by mass. The "total solid content" as referred to herein means the sum of the components other than the solvent (B).

(B) Solvent

The solvent (B) is not particularly limited as long as it is a solvent capable of dissolving or dispersing at least the polymer (A) and other component(s).

The solvent (B) is exemplified by an alcohol solvent, an ether solvent, a ketone solvent, an amide solvent, an ester solvent, a hydrocarbon solvent, and the like.

The solvent (B) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvent having 2 to 18 carbon atoms such as 1,2-propylene glycol;

polyhydric alcohol partially etherated solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole (methyl phenyl ether); and the like.

Examples of the ketone solvent include:

chain ketone solvents such as acetone, methyl ethyl ketone, methyl n-propyl ketone, methyl n-butyl ketone, diethyl ketone, methyl iso-butyl ketone (MIBK), 2-heptanone (methyl-n-pentyl ketone), ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partially etherated carboxylate solvents such as propylene glycol monomethyl ether acetate (PGMEA);

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvent is preferred, the polyhydric alcohol partially etherated carboxylate solvent is more preferred, and propylene glycol monomethyl ether acetate is still more preferred. The composition (S) may contain one, or two or more types of the solvent (B).

Other Component

The other component in the composition (S) is exemplified by a surfactant, and the like. When the composition (S) contains the surfactant, an application property onto the base material surface may be improved.

Preparation Procedure of Composition

The composition (S) may be prepared by, for example, mixing the polymer (A), the solvent (B), and as needed the other component(s) at a predetermined ratio, and preferably filtering the resulting mixture through a membrane filter, etc., having a pore size of about 200 nm. The lower limit of the solid content concentration of the composition (S) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

An application procedure of the composition (S) is exemplified by a spin-coating method, and the like. By removing the solvent (B) from the applied film obtained through the applying, a coating film (hereinafter, may be also referred to as "coating film (I)") is formed.

The coating film (I) formed as described above may be heated. As the case may be, heating of the coating film (I) can further improve the selectivity of modification of the surface of the substrate. Means for the heating may be, for example, an oven, a hot plate, and the like. The lower limit of the heating temperature is preferably 50° C., more preferably 70° C., and still more preferably 90° C. The upper limit of the heating temperature is preferably 200° C., more preferably 150° C., and still more preferably 90° C. The lower limit of the heating time period is preferably 10 sec, more preferably 1 min, and still more preferably 2 min. The upper limit of the heating time period is preferably 120 min, more preferably 10 min, and still more preferably 6 min.

The average thickness of the coating film (I) formed can be adjusted to a desired value through appropriately selecting the type and concentration of the polymer (A) in the composition (S), the amount of the composition applied, and conditions in the heating step such as the heating temperature and the heating time period. The lower limit of the average thickness of the coating film (I) is preferably 0.1 nm, more preferably 1 nm, and still more preferably 3 nm. The upper limit of the average thickness is, for example, 100 nm.

Removing Step

It is preferred that the selective modification method further includes after the applying step, a step of removing a portion formed on the region (II), of the coating film (I) (hereinafter, may be also referred to as "removing step"). When the removing step is further included, the portion containing the polymer (A) not interacting with the oxide, etc., of silicon is removed, whereby the base material having the portion on the region (I) being more selectively modified may be obtained.

The removing in the removing step is carried out typically by rinsing the base material (P) after the applying step with a rinse agent. As the rinse agent, an organic solvent is typically used, and for example, a polyhydric alcohol partially etherated carboxylate solvent such as PEGMA, a monohydric alcohol solvent such as isopropanol, or the like may be used.

The base material (P) thus obtained may be variously processed by carrying out, for example, the following step(s).

Depositing Step

In this step, a pattern is deposited by a CVD (chemical vapor deposition) method or an ALD (atom layer deposition) method on the surface of the base material (P) after the removing step. Accordingly, the pattern can be selectively formed on the region (II) not being covered with the polymer (A).

Etching Step

In this step, the polymer (A) on the surface of the base material (P) after the removing step is removed by etching.

The etching procedure is exemplified by well-known techniques including: reactive ion etching (RIE) such as chemical dry etching carried out using $CF_4$, an $O_2$ gas or the like by utilizing the difference in etching rate of each layer, etc., as well as chemical wet etching (wet development) carried out by using an etching liquid such as an organic solvent or hydrofluoric acid; physical etching such as sputtering etching and ion beam etching. Of these, the reactive ion etching is preferred, and the chemical dry etching or the chemical wet etching is more preferred.

Prior to the chemical dry etching, an irradiation with a radioactive ray may be also carried out as needed. Regarding the radioactive ray, when the portion to be removed by etching is a polymer that includes a methyl polymethacrylate block, UV irradiation or the like may be employed. Alternatively, an oxygen plasma treatment may be employed. The UV irradiation or the oxygen plasma treatment results in degradation of the methyl polymethacrylate block phase, whereby the etching is facilitated.

Examples of the organic solvent for use in the chemical wet etching include:

alkanes such as n-pentane, n-hexane and n-heptane;

cycloalkanes such as cyclohexane, cycloheptane and cyclooctane;

saturated carboxylic acid esters such as ethyl acetate, n-butyl acetate, i-butyl acetate and methyl propionate;

ketones such as acetone, methyl ethyl ketone, methyl isobutyl ketone and methyl n-pentyl ketone;

alcohols such as methanol, ethanol, 1-propanol, 2-propanol and 4-methyl-2-pentanol; and the like. These solvents may be used either alone, or two or more types thereof may be used in combination.

Electroless Plating Step

In this step, a plated layer is formed on the surface of the base material (P) after the removing step by using an electroless plating method.

In particular, it is preferred to use as the base material (P) after the removing step: a base material (Q) which is obtained by forming on a substrate that includes the metal, an interlayer film containing the oxide, etc., of silicon as a principal component, followed by forming a resist pattern on the interlayer film, and thereafter e.g., etching the interlayer film by a gas etching treatment with the resist pattern as a mask; or a base material obtained by subjecting the base material (Q) to the surface treatment step. Such a base material (Q) has the region (I) on the surfaces of the side walls of a trench pattern, and has the region (II) on bottom faces of space portions. Therefore, further carrying out the electroless plating step using such a base material (Q) in the selective modification method enables generation of a seam and a void to be inhibited in the plated layer with which the trench pattern is filled since growth of the plating film from the side walls of the trench pattern is inhibited, while selective growth from the bottom faces is permitted. The term "seam" as referred to means a defect generated at a joint with the plated layer that grows from each face of the trench pattern. The term "void" as referred to means an air space generated before sufficiently filling the bottom of the trench pattern, through covering of the opening of the trench pattern with the plated layer formed.

The metal in the region (II) of the base material (Q) is preferably copper.

The electroless plating is carried out typically by applying onto the surface of the region (II), an aqueous solution containing a metal ion that is substitutable with the metal in the region (II).

An application procedure of the metal ion-containing aqueous solution is exemplified by a spin coating method, and the like.

Prior to the applying of the metal ion-containing aqueous solution, it is preferred to form on the surface of the region (II) of the base material (Q), a catalyst layer containing a metal that is to serve as a source material for forming the electroless plated layer. Formation of the catalyst layer enables formation of the plated layer from the bottom face of the trench pattern to be more promoted. Examples of the metal constituting the catalyst layer include ruthenium, palladium, gold, platinum, and the like. Of these, ruthenium is preferred.

EXAMPLES

Hereinafter, the present invention is explained in detail by way of Examples, but the present invention is not in any way limited to these Examples. Measuring method for each physical property is shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 μL;

column temperature: 40° C.;

detector: differential refractometer; and standard substance: mono-dispersed polystyrene.

$^{13}$C-NMR Analysis $^{13}$C-NMR analysis was carried out using a nuclear magnetic resonance apparatus ("JNM-EX400" available from JEOL, Ltd.), with DMSO-$d_6$ for use as a solvent for measurement. The proportion of each structural unit in the polymer was calculated from an area ratio of a peak corresponding to each structural unit on the spectrum obtained by the $^{13}$C-NMR.

Synthesis of Polymer (A)

Synthesis Example 1

After a 500 mL flask as a reaction vessel was dried under reduced pressure, 120 g of THF which had been subjected to a distillation dehydrating treatment was charged in a nitrogen atmosphere, and cooled to −78° C. To this THF were charged 1.02 mL of 1,1-diphenylethylene, 9.59 mL of a 1 M tetrahydrofuran solution of lithium chloride and 2.47 mL a 1 N cyclohexane solution of sec-butyllithium (sec-BuLi). Moreover, 12.7 mL of methyl methacrylate which had been subjected to: adsorptive filtration by means of silica gel for removing the polymerization inhibitor; and a dehydration treatment by distillation was added dropwise over 30 min. During the dropwise addition, the internal temperature of the reaction mixture was carefully controlled so as not to be −60° C. or higher. After completion of the dropwise addition, the mixture was stirred for 90 min. Next, 1.1 mL of N,N-dimethylaminoethyl methacrylate was added and the mixture was further stirred for 30 min, and then 1 mL of methanol was further charged thereto to conduct a terminating reaction of the polymerization end. The temperature of the reaction mixture was elevated to the room temperature, and the resulting reaction mixture was concentrated, followed by substitution with MIBK. Thereafter, 1,000 g of a 2% by mass aqueous triethylamine solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and then the solution was concentrated. The concentrate was added dropwise into 500 g of methanol to allow the polymer to be precipitated, and the solid was collected on a Buechner funnel. This polymer was dried under reduced pressure at 60° C. to give 12.6 g of a white block copolymer represented by the following formula (A-1). The polymer (A-1) had the Mw of 5,200, the Mn of 5,000, and the Mw/Mn of 1.04. As a result of the $^{13}$C-NMR measurement, the block composition ratio was revealed to be 95 mol % for methyl methacrylate, and 5 mol % for N,N-dimethylaminoethyl methacrylate.

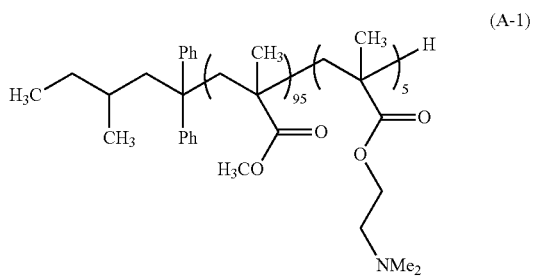

(A-1)

Synthesis Example 2: Synthesis of Polymer (A-2)

After a 500 mL flask as a reaction vessel was dried under reduced pressure, 120 g of THF which had been subjected to a distillation dehydrating treatment was charged in a nitrogen atmosphere, and cooled to −78° C. To this THF were charged 5.12 mL of a 1 M tetrahydrofuran solution of lithium chloride and 1.32 mL a 1 N cyclohexane solution of sec-butyllithium (sec-BuLi). Moreover, 13.3 mL of styrene which had been subjected to: adsorptive filtration by means of silica gel for removing the polymerization inhibitor; and a dehydration treatment by distillation was added dropwise over 30 min. During the dropwise addition, the internal temperature of the reaction mixture was carefully controlled so as not to be −60° C. or higher. Next, 0.54 mL of 1,1-diphenylethylene was added and then 0.60 mL of N,N-dimethylaminoethyl methacrylate was added thereto. The mixture was further stirred for 120 min, and 1 mL of methanol was further charged thereto to conduct a terminating reaction of the polymerization end. The temperature of the reaction mixture was elevated to the room temperature, and the resulting reaction mixture was concentrated, followed by substitution with MIBK. Thereafter, 1,000 g of a 2% by mass aqueous triethylamine solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. The solution was concentrated and the concentrate was added dropwise into 500 g of methanol to allow the polymer to be precipitated, and the solid was collected on a Buechner funnel. This polymer was dried under reduced pressure at 60° C. to give 12.0 g of a white block copolymer represented by the following formula (A-2). The polymer (A-2) had the Mw of 10,800, the Mn of 9,800, and the Mw/Mn of 1.10. As a result of the $^{13}$C-NMR measurement, the block composition ratio was revealed to be 97 mol % for styrene, and 3 mol % for N,N-dimethylaminoethyl methacrylate.

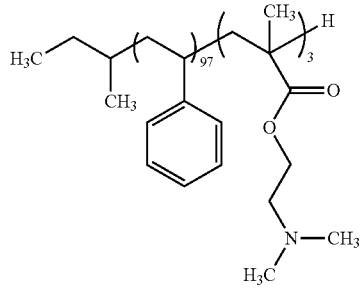

(A-2)

Synthesis Example 3: Synthesis of Polymer (A-3)

After a 500 mL flask as a reaction vessel was dried under reduced pressure, 120 g of THF which had been subjected to a distillation dehydrating treatment was charged in a nitrogen atmosphere, and cooled to −78° C. To this THF were charged 1.54 mL of a 1 M tetrahydrofuran solution of lithium chloride and 0.38 mL a 1 N cyclohexane solution of sec-butyllithium (sec-BuLi). Moreover, 13.3 mL of styrene which had been subjected to: adsorptive filtration by means of silica gel for removing the polymerization inhibitor; and a dehydration treatment by distillation was added dropwise over 30 min. During the dropwise addition, the internal temperature of the reaction mixture was carefully controlled so as not to be −60° C. or higher. Next, 0.16 mL of 1,1-diphenylethylene was added and then 0.60 mL of N,N-dimethylaminoethyl methacrylate was added thereto. The mixture was further stirred for 120 min, and 1 mL of methanol was further charged thereto to conduct a terminating reaction of the polymerization end. The temperature of the reaction mixture was elevated to the room temperature, and the resulting reaction mixture was concentrated, followed by substitution with MIBK. Thereafter, 1,000 g of a 2% by mass aqueous triethylamine solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. The solution was concentrated and the concentrate was added dropwise into 500 g of methanol to allow the polymer to be precipitated, and the solid was collected on a Buechner funnel. This polymer was dried under reduced pressure at 60° C. to give 12.0 g of a white block copolymer represented by the following formula (A-3). The polymer (A-3) had the Mw of 33,200, the Mn of 30,000, and the Mw/Mn of 1.11. As a result of the $^{13}$C-NMR measurement, the block composition ratio was revealed to be 97 mol % for styrene, and 3 mol % for N,N-dimethylaminoethyl methacrylate.

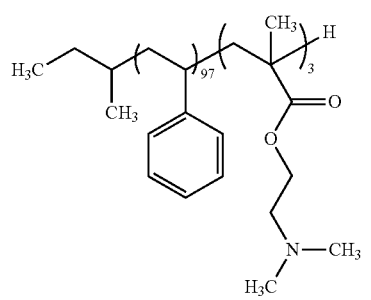

(A-3)

Synthesis Example 4: Synthesis of Polymer (A-4)

After a 500 mL flask as a reaction vessel was dried under reduced pressure, 120 g of THF which had been subjected to a distillation dehydrating treatment was charged in a nitrogen atmosphere, and cooled to −78° C. To this THF were charged 4.61 mL of a 1 M tetrahydrofuran solution of lithium chloride and 2.08 mL a 1 N cyclohexane solution of sec-butyllithium (sec-BuLi). Moreover, 13.3 mL of styrene which had been subjected to: adsorptive filtration by means of silica gel for removing the polymerization inhibitor; and a dehydration treatment by distillation was added dropwise over 30 min. During the dropwise addition, the internal temperature of the reaction mixture was carefully controlled so as not to be −60° C. or higher. Next, 0.98 mL of 1,1-diphenylethylene was added and then 0.60 mL of N,N-dimethylaminoethyl methacrylate was added thereto. The mixture was further stirred for 120 min, and 1 mL of methanol was further charged thereto to conduct a terminating reaction of the polymerization end. The temperature of the reaction mixture was elevated to the room temperature, and the resulting reaction mixture was concentrated, followed by substitution with MIBK. Thereafter, 1,000 g of a 2% by mass aqueous triethylamine solution was charged and the mixture was stirred. After leaving to stand, the aqueous underlayer was removed. This operation was repeated three times to remove the Li salt. Thereafter, 1,000 g of ultra pure water was charged and the mixture was stirred, followed by removing the aqueous underlayer. The solution was concentrated and the concentrate was added dropwise into 500 g of methanol to allow the polymer to be precipitated, and the solid was collected on a Buechner funnel. This polymer was dried under reduced pressure at 60° C. to give 12.0 g of a white block copolymer represented by the following formula (A-4). The polymer (A-4) had the Mw of 6,800, the Mn of 6,000, and the Mw/Mn of 1.13. As a result of the $^{13}$C-NMR measurement, the block composition ratio was revealed to be 97 mol % for styrene, and 3 mol % for N,N-dimethylaminoethyl methacrylate.

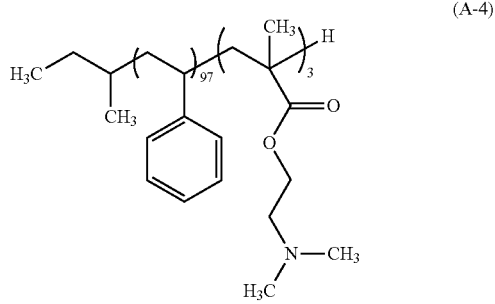

(A-4)

Preparation of Nonphotosensitive Composition

The polymers (A) and the solvent (B) used for preparing the nonphotosensitive composition are shown below.

(A) Polymers

A-1 to A-4: polymers (A-1) to (A-4) synthesized in Synthesis Examples 1 to 4 described above (B) Solvent B-1: propylene glycol monomethyl ether acetate Preparation Example 1

A nonphotosensitive composition (S-1) was prepared by mixing 100 parts by mass of (A-1) as the polymer (A), and 9,900 parts by mass of (B-1) as the solvent (B), and filtering the resultant mixed solution through a membrane filter having a pore size of 200 nm.

Preparation Example 2

A nonphotosensitive composition (S-2) was prepared by mixing 100 parts by mass of (A-2) as the polymer (A), and 9,900 parts by mass of (B-1) as the solvent (B), and filtering the resultant mixed solution through a membrane filter having a pore size of 200 nm.

Preparation Example 3

A nonphotosensitive composition (S-3) was prepared by mixing 100 parts by mass of (A-3) as the polymer (A), and 9,900 parts by mass of (B-1) as the solvent (B), and filtering the resultant mixed solution through a membrane filter having a pore size of 200 nm.

Preparation Example 4

A nonphotosensitive composition (S-4) was prepared by mixing 100 parts by mass of (A-4) as the polymer (A), and 9,900 parts by mass of (B-1) as the solvent (B), and filtering the resultant mixed solution through a membrane filter having a pore size of 200 nm.

Selective Modification of Base Material Surface

Examples 1 to 4

An $SiO_2$ substrate as an interlayer insulating film, and a tungsten substrate, a cobalt substrate and a copper substrate as metal films were each prepared, and these substrates were subjected to a surface treatment of the substrate through an irradiation with oxygen gas plasma, by using a plasma irradiation apparatus ("TACTRAS" available from Tokyo Electron Limited), and thereafter surface conditions were evaluated by using a contact angle scale.

Subsequently, coating films of the nonphotosensitive compositions (S-1) to (S-4) were formed, respectively, and rinsed with PGMEA. Then, the surface conditions of the substrates were evaluated by using a contact angle scale. The results of the evaluations are shown together in Table 1. "Blank-1" and "Blank-2" shown in Table 1 denote the cases in which the applying of the nonphotosensitive composition was not conducted.

Furthermore, the differences in contact angles between the interlayer insulating film surfaces and metal film surfaces are shown in Table 2. The difference being greater indicates that support selectivity on the interlayer insulating film surface is favorable.

Comparative Examples 1 and 2

An $SiO_2$ substrate as an interlayer insulating film, and a tungsten substrate, a cobalt substrate and a copper substrate as metal films were each prepared, and surface conditions were evaluated by using a contact angle scale, without carrying out the surface treatment of the substrate.

Subsequently, similarly to Examples 1 to 4, coating films of the nonphotosensitive compositions (S-1) to (S-4) were formed, respectively, and rinsed with PGMEA. Then, the surface conditions of the substrates were evaluated by using a contact angle scale. The results of the evaluations are shown together in Table 1.

TABLE 1

| Nonphoto-sensitive composition | (A) Poly-mer | $O_2$ plasma treat-ment | Contact angle (°) | | | |
|---|---|---|---|---|---|---|
| | | | $SiO_2$ | Cu | Co | W |
| Blank-1 | — | — | done | <30 | <30 | <30 | <30 |
| Example 1 | S-1 | A-1 | done | 89 | 61 | 56 | 50 |
| Example 2 | S-2 | A-2 | done | 90 | 58 | 55 | 48 |
| Example 3 | S-3 | A-3 | done | 90 | 57 | 56 | 49 |

TABLE 1-continued

| | Nonphotosensitive composition | (A) Polymer | O$_2$ plasma treatment | Contact angle (°) | | | |
|---|---|---|---|---|---|---|---|
| | | | | SiO$_2$ | Cu | Co | W |
| Example 4 | S-4 | A-4 | done | 90 | 57 | 56 | 50 |
| Blank-2 | — | — | not done | 53 | 75 | 70 | 53 |
| Comparative Example 1 | S-1 | A-1 | not done | 83 | 66 | 62 | 88 |
| Comparative Example 2 | S-2 | A-2 | not done | 90 | 73 | 74 | 84 |

TABLE 2

| | Nonphotosensitive composition | (A) Polymer | ΔSCA (°) (SCA (SiO$_2$) - SCA (metal)) | | |
|---|---|---|---|---|---|
| | | | Cu | Co | W |
| Example 1 | S-1 | A-1 | 28 | 33 | 39 |
| Example 2 | S-2 | A-2 | 32 | 35 | 42 |
| Example 3 | S-3 | A-3 | 33 | 34 | 41 |
| Example 4 | S-4 | A-4 | 33 | 34 | 40 |
| Comparative Example 1 | S-1 | A-1 | 17 | 21 | 5 |
| Comparative Example 2 | S-2 | A-2 | 17 | 16 | 6 |

Comparison of the results of Examples with those of Comparative Examples reveals that the oxygen gas plasma treatment as the surface treatment allowed the surface of the substrate to be oxidized, indicating the surface modification executed. In addition, the oxygen gas plasma treatment promoted the support of the polymer on the SiO$_2$ substrate surface, whereas the support of the polymer on the surfaces of the tungsten, cobalt and copper substrates was inhibited, consequently indicating that support selectivity on the SiO$_2$ substrate surface was improved.

The selective modification method of a base material surface of the embodiment of the present invention enables convenient and highly selective modification at a surface region where the oxide, etc., of silicon is contained. Therefore, the selective modification method of a base material surface can be suitably used for working processes of semiconductor devices, and the like, in which microfabrication is expected to be further in progress hereafter.

Obviously, numerous modifications and variations of the present invention are possible in light of the above teachings. It is therefore to be understood that within the scope of the appended claims, the invention may be practiced otherwise than as specifically described herein.

What is claimed is:

1. A method of selectively modifying a base material surface, comprising:
    applying a surface treatment at least partially to a surface of a base material comprising a surface layer that has a first region including an oxide, a nitride or an oxynitride of silicon, or a combination thereof, and a second region including a metal;
    applying a nonphotosensitive composition directly or indirectly on the surface of the base material after the surface treatment, such that a coating film is formed on the first region and the second region of the surface layer; and
    rinsing the base material such that a portion of the coating film formed on the first region of the surface layer remains and that a portion of the coating film formed on a second region is removed,
    wherein the surface treatment includes at least one of an oxidization treatment and a hydrophilization treatment, and
    the nonphotosensitive composition comprises a solvent and a first polymer comprising a tertiary amino group on a side chain, such that the first polymer selectively modifies the first region of the surface layer of the base material.

2. The method according to claim 1, wherein the surface treatment comprises carrying out an O$_2$ plasma treatment.

3. The method according to claim 1, wherein the base material includes an oxide of silicon in the first region.

4. The method according to claim 1, wherein the base material includes SiO$_2$ in the first region.

5. The method according to claim 1, wherein the tertiary amino group is one of a dimethylamino group, a diethylamino group, a dicyclopentylamino group, a dicyclohexylamino group, a diphenylamino group, a dibenzylamino group, a methylethylamino group, and a phenylmethylamino group.

6. The method according to claim 1, wherein the tertiary amino group is a dimethylamino group.

7. The method according to claim 1, wherein the tertiary amino group is one of a 1-pyrrolidinyl group, a 1-piperidyl group, and a 4-morpholino group.

8. The method according to claim 1, wherein the metal is at least one of copper, iron, zinc, cobalt, aluminum, tin, tungsten, zirconium, titanium, tantalum, germanium, molybdenum, ruthenium, gold, silver, platinum, palladium, and nickel.

9. The method according to claim 1, wherein the metal is included in a form which is one of a metal simple substance, an alloy, an electric conductive nitride, a metal oxide, a silicide.

10. The method according to claim 1, wherein the metal is included in a form which is one of a copper simple substance, a cobalt simple substance, and a tungsten simple substance.

11. The method according to claim 1, wherein the metal is included in a form which is one of a nickel-copper alloy, a cobalt-nickel alloy, and a gold-silver alloy.

12. The method according to claim 1, wherein the metal is included in a form which is one of tantalum nitride, titanium nitride, iron nitride, and aluminum nitride.

13. The method according to claim 1, wherein the metal is included in a form which is one of iron silicide and molybdenum silicide.

14. The method according to claim 1, wherein the rinsing includes applying a rinsing agent which is one of a polyhydric alcohol partially etherated carboxylate solvent and a monohydric alcohol solvent.

15. The method according to claim 1, wherein the rinsing includes applying a rinsing agent which is one of PEGMA and isopropanol.

16. The method according to claim 1, wherein the solvent comprises at least one of an alcohol solvent, an ether solvent, a ketone solvent, an amide solvent, an ester solvent, and a hydrocarbon solvent.

17. The method according to claim 1, wherein the solvent comprises an ester solvent.

18. The method according to claim 1, wherein the solvent comprises a polyhydric alcohol partially etherated carboxylate solvent.

19. The method according to claim 1, wherein the solvent comprises propylene glycol monomethyl ether acetate.

20. The method according to claim 1, wherein the surface treatment is applied entirely to the surface of the base material.

\* \* \* \* \*